United States Patent [19]
Matsui et al.

[11] Patent Number: 5,764,591
[45] Date of Patent: Jun. 9, 1998

[54] MEMORY DEVICE AND MEMORY CONTROL CIRCUIT

[75] Inventors: Noriyuki Matsui; Yuzo Usui, both of Kawasaki, Japan

[73] Assignee: Fujitsu Limited, Kawasaki, Japan

[21] Appl. No.: 724,475

[22] Filed: Oct. 1, 1996

[30]     Foreign Application Priority Data

Apr. 4, 1996  [JP]  Japan ................................ 8-082773

[51] Int. Cl.⁶ .................................. G11C 8/00; G11C 7/00
[52] U.S. Cl. ................... 365/233.5; 365/194; 365/189.5
[58] Field of Search ......................... 365/233.5, 189.05, 365/194

[56]            References Cited

U.S. PATENT DOCUMENTS 5,602,795  2/1997  Sandhu ................................ 365/233.5
5,651,126  7/1997  Bailey et al. ....................... 365/233.5

*Primary Examiner*—David C. Nelms
*Assistant Examiner*—Trong Phan
*Attorney, Agent, or Firm*—Staas & Halsey

[57]             ABSTRACT

A memory device having a memory element including a plurality of memory cells each designated by a row address signal and a column address signal, and a circuit for detecting a transition between the row address signal and the column address signal to thereby effect an equalize operation on the memory element. The supply of a row/column address signal including the row address signal and the column address signal to the memory element is cut off during a logical indeterminate period at the time of the transition. The row/column address signal immediately before its cutoff is held and the held signal is supplied to the memory element during the logical indeterminate period. Thus, a high-speed operation can be done by the equalize operation and the cutoff can provide the prevention of occurrence of a malfunction due to noise such as a glitch or the like.

10 Claims, 10 Drawing Sheets

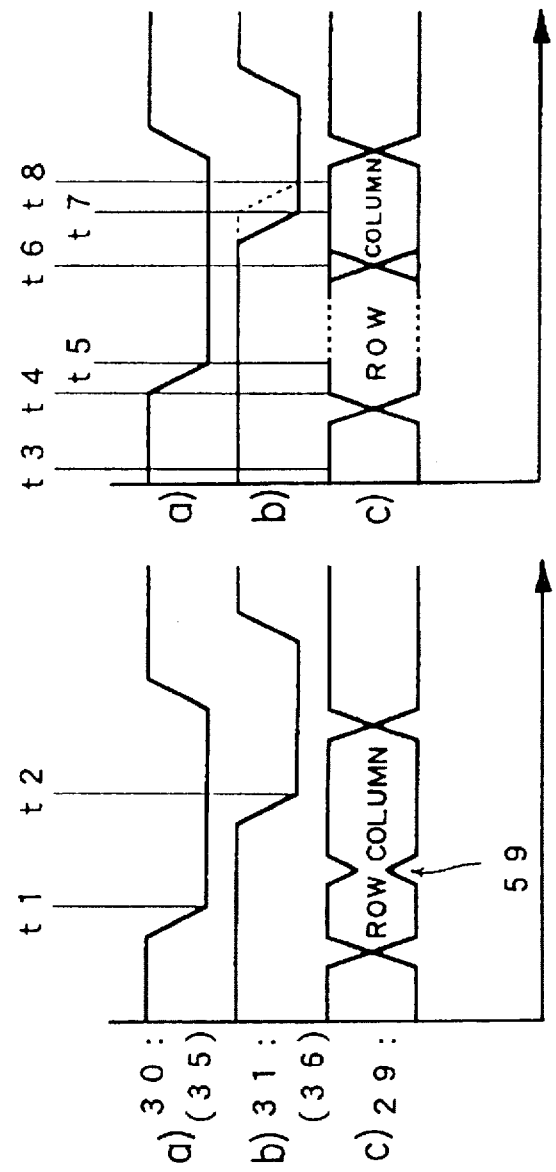

MEMORY DEVICE AND MEMORY CONTROL CIRCUIT

BACKGROUND OF THE INVENTION

1. Field of the Invention

The present invention generally relates to a memory device and a memory control circuit, and more specifically to the speeding up of a memory device and an increase in reliability thereof.

1. Description of the Related Art

A memory device has heretofore been known which includes a memory element having a plurality of memory cells each specified(addressed) by a row address signal and a column address signal and a means for detecting a transition between the row address signal and the column address signal to thereby effect an equalize operation on the memory element.

In order to perform the equalize operation, an address transition detecting (ATD) circuit is employed for a DRAM (Dynamic Random Access Memory) or SRAM (Static Random Access Memory), for example. The ATD circuit detects the transition between the row address signal and the column address signal. The state of the inside of the memory element is initialized based on the result of detection, so that the access time can be shortened. When a row/column address signal including the row address signal and the column address signal is changed from "1" to "0" or "0" to "1", the ATD circuit generates a control pulse. The memory element is equalized based on the control pulse and the operation timing of a sense amplifier provided attendantly onto the memory element is adjusted so as to speed up a read cycle.

A logical indeterminate period is occasionally produced without normally making the transition between the row address signal and the column address signal. When, for example, switching noise or the like is caused to thereby produce an improper waveform in the row/column address signal, the ATD circuit malfunctions so as to interfere with the equalize operation of the memory element and produce misreading of a decoder by multiple selection. If the worst comes to the worst, then data stored in each memory cell is destroyed.

SUMMARY OF THE INVENTION

With the foregoing in view, it is therefore an object of the present invention to provide a memory device capable of being operated at high speed and preventing a malfunction from occurring.

It is another object of the present invention to provide a memory control circuit suitable for speeding up a memory device and providing high reliability thereof.

According to one aspect of the present invention, there is provided a memory device comprising a memory element having a plurality of memory cells each specified by a row address signal and a column address signal, a first means for detecting a transition between the row address signal and the column address signal to thereby effect an equalize operation on the memory element, a second means for cutting off the supply of a row/column address signal including the row address signal and the column address signal to the memory element during a logical indeterminate period at the time of the transition, and a third means for holding the row/column address signal immediately before the cutoff of the supply of the row/column address signal to the memory element and supplying the held signal to the memory element during the logical indeterminate period.

According to the other aspect of the present invention, there is provided a memory device comprising a memory element having a plurality of memory cells each specified by a row address signal and a column address signal, a first means for detecting a transition between the row address signal and the column address signal to thereby effect an equalize operation on the memory element, and a second means for forcefully inverting the logic of a row/column address signal including the row address signal and the column address signal with timing close to a logical indeterminate period at the time of the transition.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

The present invention will now be described with reference to the accompanying drawings wherein:

FIGS. 9A and 9B are respectively timing charts corresponding to those shown in FIGS. 3 and 2;

DETAILED DESCRIPTION OF THE PREFERRED EMBODIMENTS

Preferred embodiments of the present invention will hereinafter be described in detail with reference to the accompanying drawings.

Figure 1:
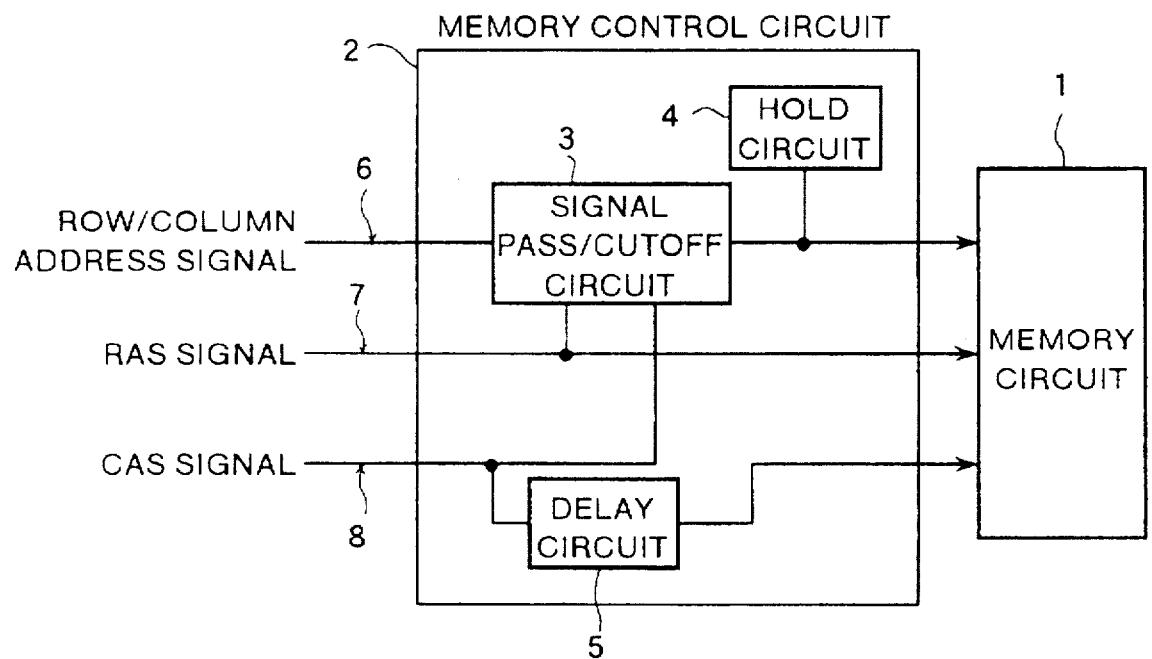
FIG. 1 is a block diagram showing a basic configuration of a memory device according to the present invention.

FIG. 1 shows a basic configuration of a memory device according to the present invention. The present device has a memory circuit 1 and a memory control circuit 2. The memory control circuit 2 includes a signal pass/cutoff circuit 3, a hold circuit 4 and a delay circuit 5. The memory device detects the transition of a row/column address signal 6 from a row address signal to a column address signal so as to perform an equalize operation. The transition thereof from the column address signal to the row address signal may be detected. When a row address strobe (RAS) signal 7 for taking in or capturing the row address signal is input to the signal pass/cutoff circuit 3, the signal pass/cutoff circuit 3 brings the row/column address signal 6 to be outputted to the memory circuit 1 into a cut-off state. When a column address strobe (CAS) signal 8 for capturing the column address signal is input to the signal pass/cutoff circuit 3, the signal pass/cutoff circuit 3 brings the row/column address signal 6 into a passed state. The hold circuit 4 holds the row/column address signal 6 that passes through the signal pass/cutoff circuit 3, and outputs the held signal to the memory circuit 1 upon the cut-off state. The delay circuit 5 delays the CAS signal 8 by a predetermined time interval and supplies the delayed signal to the memory circuit 1. The time required to delay the CAS signal 8 is set in such a manner that the column address signal of the row/column address signal 6 is reliably captured upon switching of the row/column address signal 6 from the cut-off state to the passed state, for example.

According to the above configuration, the row/column address signal 6, which has been held by the hold circuit 4 immediately before the cut-off state, is supplied to the memory circuit 1 when the row/column address signal 6 is in the cut-off state. The transition from the row address signal to the column address signal is performed in the cut-off state. Since the cut-off state is kept even if noise is produced upon its transition, the memory device is prevented from malfunctioning.

Incidentally, a DRAM or SRAM can be used as the memory circuit 1. The memory circuit 1 and the memory control circuit 2 may be formed on a common semiconductor chip. However, only the memory circuit 1 is formed on a single semiconductor chip and the memory control circuit 2 may be provided as an external circuit.

Figure 2:
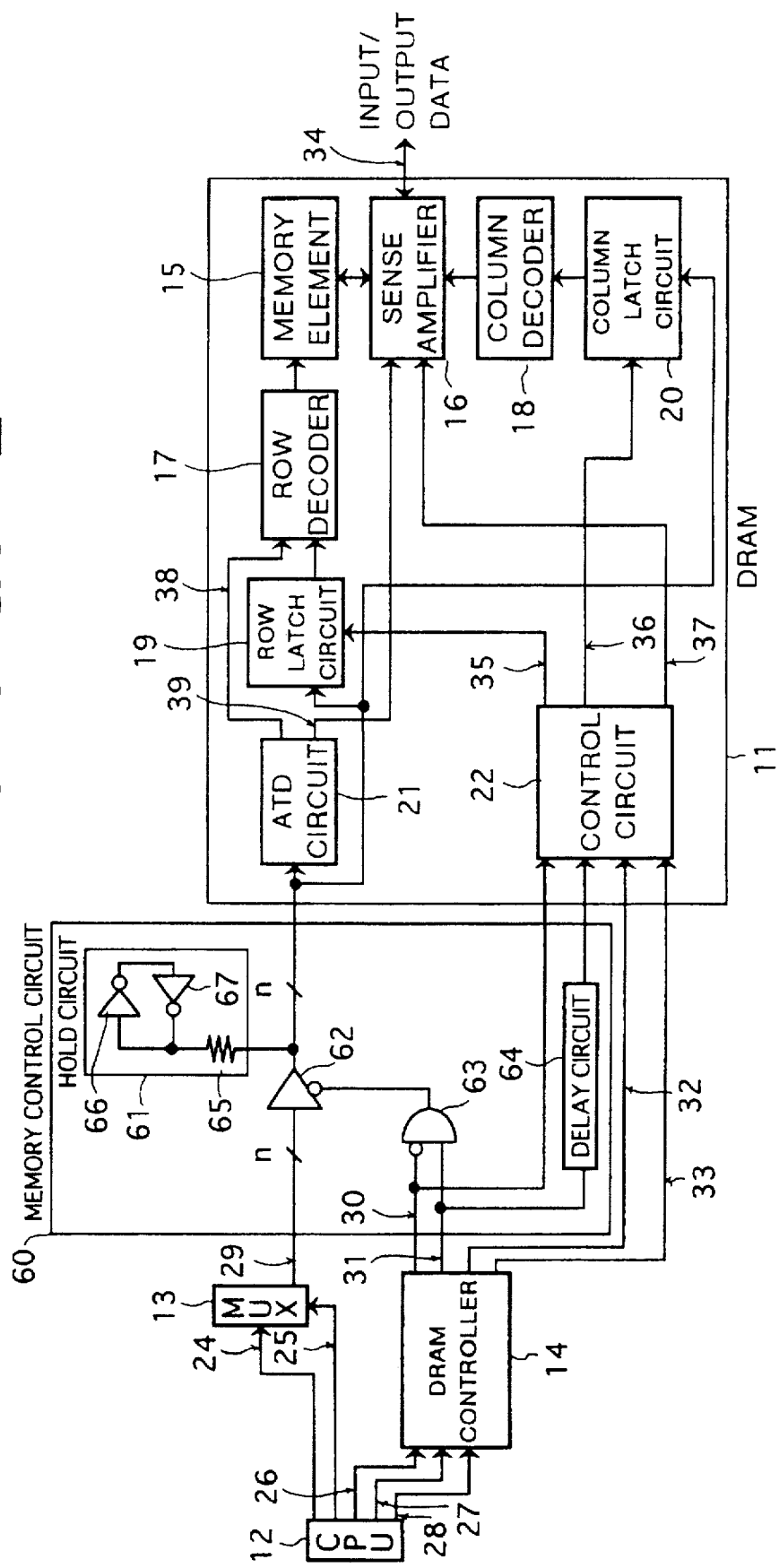
FIG. 2 is a block diagram illustrating a first embodiment of a memory device according to the present invention.

FIG. 2 illustrates a first embodiment of a memory device according to the present invention. The memory device is characterized by a memory control circuit 60. In order to make clear the effectiveness of the memory control circuit 60, the configuration and operation of the memory device free of the memory control circuit 60 will first be explained.

Figure 3:
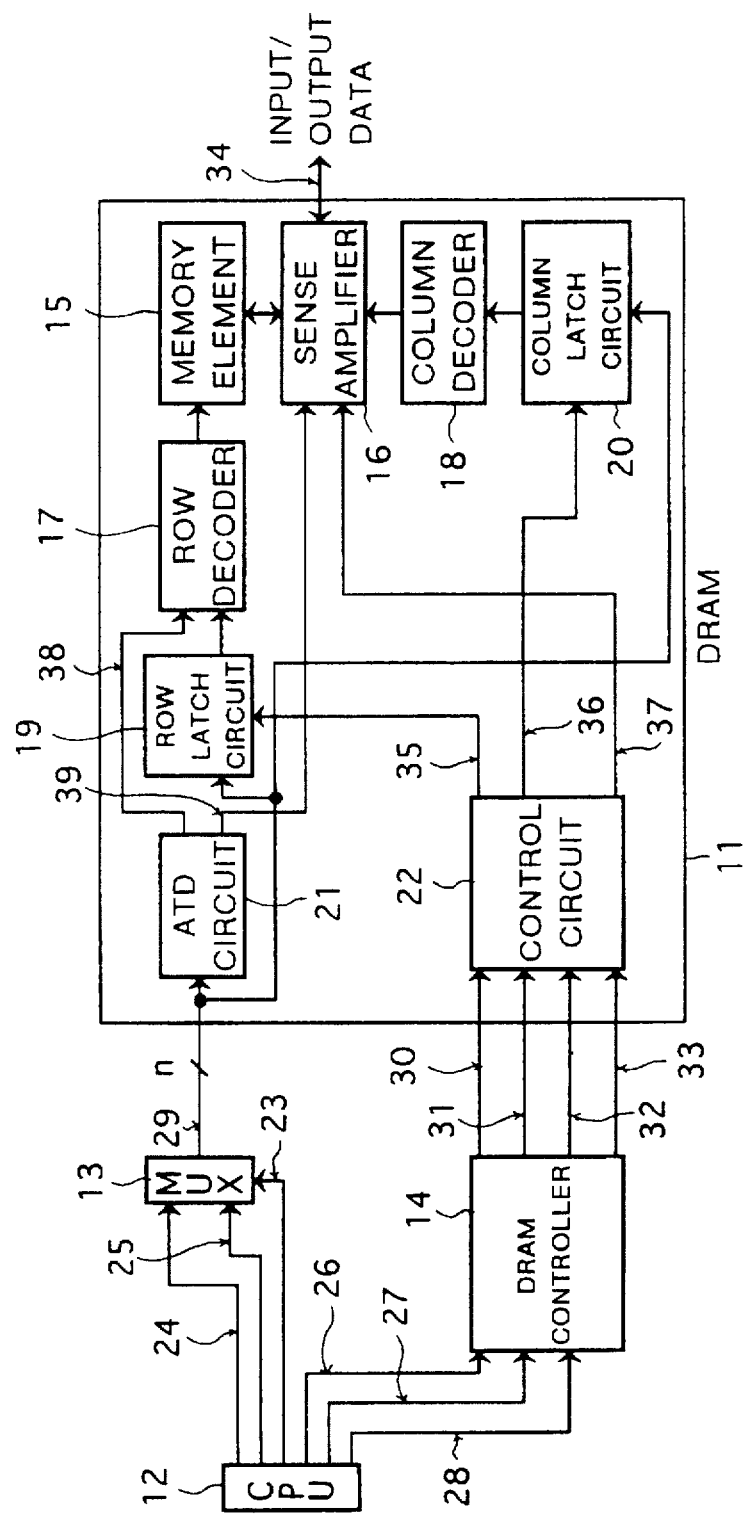
FIG. 3 is a block diagram depicting a circuit configuration from which a memory control circuit is removed from the circuit configuration shown in FIG. 2.

FIG. 3 shows the configuration of the memory device, which is formed by eliminating the memory control circuit 60 from the configuration shown in FIG. 2. In the same drawing, reference numerals 11, 12, 13 and 14 respectively indicate a DRAM (memory circuit), a CPU, a multiplexer (MUX), and a DRAM controller. The DRAM 11 includes a memory element 15, a sense amplifier 16, a row decoder 17, a column decoder 18, a row latch circuit 13, a column latch circuit 20, an ATD circuit 21 and a control circuit 22.

The CPU 12 is connected to the MUX 13 and the DRAM controller 14. The CPU 12 outputs a row address signal 24, a column address signal 25 and a row/column address switching clock signal 23 to the MUX 13. Further, the CPU 12 outputs a RAS (Row Address Strobe) generating clock signal 26, a CAS (Column Address Strobe) generating clock signal 27 and a read/write signal 28 to the DRAM controller 14.

Figure 4:
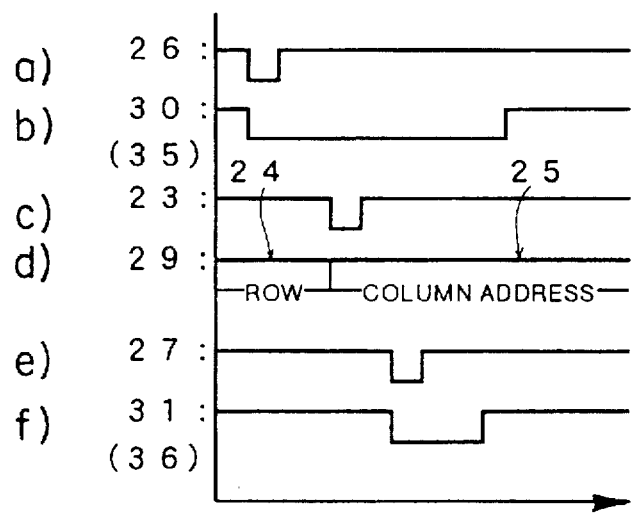
FIG. 4 is a timing chart for describing memory control executed by a CPU.

The MUX 13 is connected to the ATD circuit 21, the row latch circuit 19 and the column latch circuit 20. The MUX 13 multiplexes the row address signal 24 and the column address signal 25 sent from the CPU 12 into a row/column address signal 29 in which the row address signal 24 and the column address signal 25 are switched for each falling edge of the row/column address switching clock signal 23 as shown in FIG. 4, and outputs it to the ATD circuit 21, the row latch circuit 19 and the column latch circuit 20. Here, the number of address lines for connecting the MUX 13 and the respective circuits 21, 19 and 20 to one another will be defined as n.

The DRAM controller 14 is connected to the control circuit 22. The DRAM controller 14 generates a RAS signal 30 from the RAS generating clock signal 26 as shown in FIG. 4 and produces a CAS signal 31 from the CAS generating clock signal 27. Further, the DRAM controller 14 generates an OE (Out Enable) signal 32 and a WE (Write Enable) signal 33 from the read/write signal 28 and outputs the generated signals 30 through 33 to the control circuit 22.

An output of the ATD circuit 21 in the DRAM 11 is electrically connected to control inputs of the row decoder 17 and the sense amplifier 16. Outputs of the control circuit 22 are respectively electrically connected to a control input of the row latch circuit 19, a control input of the column latch circuit 20 and a control input of the sense amplifier 16. Further, the output of the column latch circuit 19 is electrically connected to its corresponding input of the row decoder 17, the output of the row decoder 17 is electrically connected to an address line of the memory element 15, the output of the column latch circuit 20 is electrically connected to the input of the column decoder 18, and the output of the column decoder 18 is electrically connected to a bit line of the memory element 15 through the sense amplifier 16. Data (input/output data) designated at numeral 34 to be sent to the memory element 15 is inputted to and outputted from the sense amplifier 16.

The control circuit 22 outputs a RAS signal 35 corresponding to the RAS signal 30 to the row latch circuit 19 and outputs a CAS signal 36 corresponding to the CAS signal 31 to the column latch circuit 20. Further, the control circuit 22 outputs an O/W signal 37 corresponding to either of the OE signal 32 and the WE signal 33 to the sense amplifier 16.

The row latch circuit 19 latches the row/address signal 29 indicative of a row address in response to the falling edge of the RAS signal 35, going from an "H" to an "L" levels and outputs it to the memory element 15 through the row decoder 17. Thus, the row address for the memory element 15 is specified. The column latch circuit 20 latches the row/column address signal 29 indicative of a column address in response to the falling edge of the CAS signal 36 and outputs it to the memory element 15 through the column decoder 18 and the sense amplifier 16. Thus, the column address for the memory element 15 is specified. Since the row and column addresses are specified by these specifications, the data stored in the memory element 15 is read through the sense amplifier 16 when the O/W signal 37 supplied to the sense amplifier 16 is of the OE signal 32, whereas when the O/W signal 37 is of the WE signal 33, data is written into the memory element 15 through the sense amplifier 16.

Figure 5:
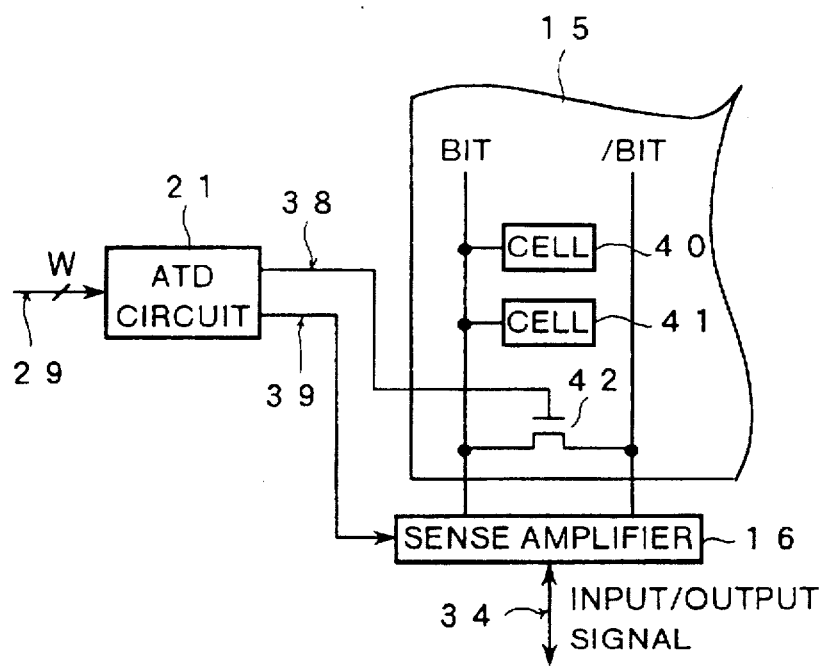
FIG. 5 is a block diagram for describing the operation of an ATD circuit.

The ATD circuit 21 detects the transition of the row/column address signal 29 from the row address signal 24 to the column address signal 25 and thereby outputs a first ATD pulse 38 to the memory element 15 through the row decoder 17. Further, the ATD circuit 21 detects that the column address after the transition has been determined as "0" or "1" and thereby outputs a second ATD pulse 39 to the sense amplifier 16. As shown in FIG. 5, the first ATD pulse 38 is supplied to the gate of a transistor 42 electrically connected between a bit line (BIT) and a bar bit line (BIT) corresponding to a complementary bit line pair in the memory element 15.

Figure 6:
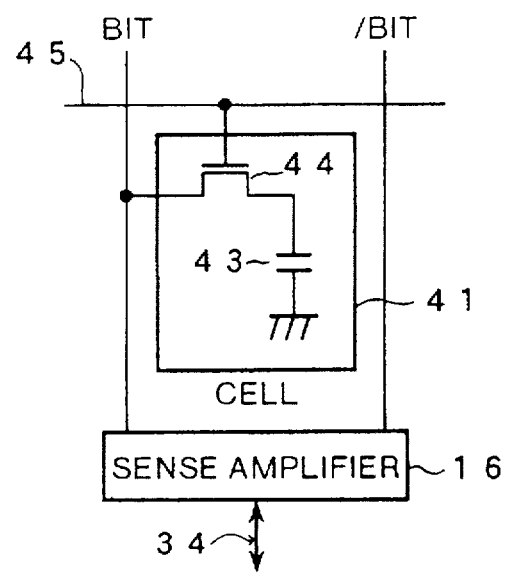
FIG. 6 is a block diagram showing the structure of each cell employed in a memory element.

The bit line and the bar bit line are electrically connected to the sense amplifier 16. The bit line is electrically connected with memory cells 40 and 41 provided within the memory element 15. Each of the memory cells 40 and 41 comprises a capacitor 43 and a transistor 44 as shown in FIG. 6. The gate of the transistor 44 is electrically connected to an address line 45, the drain thereof is electrically connected to the bit line and the source thereof is electrically connected to ground through the capacitor 43.

Figure 7:
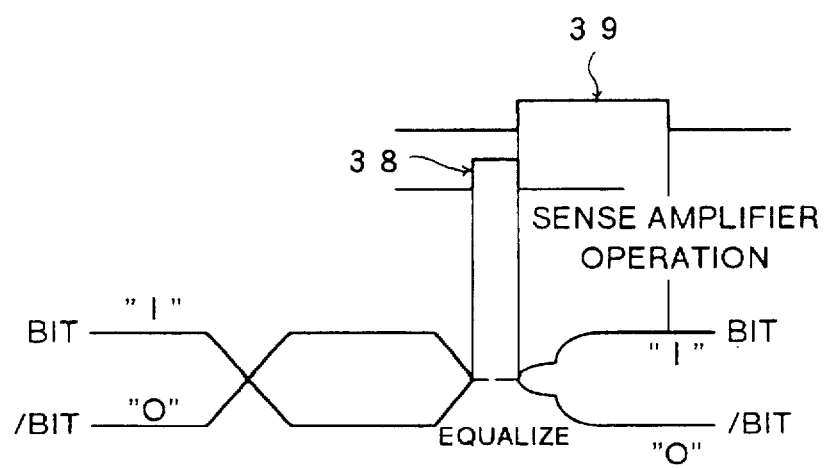
FIG. 7 is a view for describing an equalize operation and a sense amplifying operation.

The bit line and the bar bit line are contrary in level to each other as in the case where as shown in FIG. 7, when the bit line is normally represented as "1", the bar bit line is represented as "0", whereas when the bit line is represented as "0", the bar bit line is represented as "1". On the other hand, when the first ATD pulse 38 is supplied to the gate of the transistor 42 shown in FIG. 5 to turn on the transistor 42, the bit line and the bar bit line are substantially brought to the same potential. This is called "equalize operation". Described specifically, the equalize operation means that the potential at each of the bit line and the bar bit line is set to an intermediate potential (Vcc/2) to reset the sense amplifier 16. If the potential of the capacitor 43 is maintained at a level higher than Vcc/2 upon the equalize operation, then a level slightly higher than Vcc/2 is outputted from the sense amplifier 16 when reading is performed based on the CAS signal 36. Thereafter, if the sense amplifier 16 is activated based on the second ATD pulse 39 to amplify the level slightly higher than Vcc/2, then data of "1" is immediately outputted from the sense amplifier 16. On the other hand, if, when a level slightly lower than Vcc/2 has been outputted upon the equalize operation, the sense amplifier 16 is activated to amplify the level, then data of "0" is immediately outputted from the sense amplifier 16. Thus, if the sense amplifier 16 is reset in response to the detection of the transition of the row/column addresses, then data at the address determined by the CAS signal 36 can be outputted so quickly.

Figure 8A:
FIGS. 8A and 8B are respectively views showing examples of noise produced in a row/column address signal.
Figure 8B:
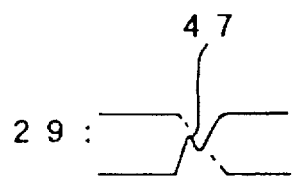

Now, the aforementioned ATD circuit 21 is based on the premise that when the transition is normally done, the ATD circuit 21 outputs the first ATD pulse 38. When the transition of the row/column address signal 29 is not normally performed, a small pulse of noise called "glitch" is produced in the row/column address signal 29 as designated at numeral 46 in FIG. 8A, or noise of a steplike offset level is produced therein as designated at numeral 47 in FIG. 8A. Such noise is produced upon switching of the MUX 13 used as an address control circuit, for example.

Thus, when the memory control circuit 60 shown in FIG. 2 is not provided, the ATD circuit 21 malfunctions due to the noise. As a result, the equalize operation was made insufficient and the data amplified by the sense amplifier 16 often produced errors.

As shown in FIG. 9A, a glitch (noise) designated at numeral 59 results from a logical indeterminate period which occurs between the falling edge of the RAS signal 30 (35) at a time t1 and the falling edge of the CAS signal 31 (36) at a time t2. Thus, in the first embodiment shown in FIG. 2, the memory control circuit 60 is provided to cut off the supply of the row/column address signal 29 to the memory circuit 11 during the logical indeterminate period.

The memory control circuit 60 has a hold circuit 61, a tristate buffer 62, an AND circuit 63 and a delay circuit 64. An input port of the buffer 62 is supplied with the row/column address signal 29 outputted from the MUX 13. An output port of the buffer 62 is electrically connected to the ATD circuit 21, the row latch circuit 19 and the column latch circuit 20. A control port of the buffer 62 is electrically connected to an output port of the AND circuit 63. The control port of the buffer 62 corresponds to an inversion input. Thus, when the signal supplied to the control port of the buffer 62 is "L" in level, the buffer 62 outputs a logical level applied to the input port thereof from the output port thereof as it is. When the signal supplied to the control port thereof is "H" in level, the buffer 62 is brought to high impedance so as to cut off between the input port and the output port. The AND circuit 63 has two input ports. One of these corresponds to an inversion input, which is supplied with the RAS signal 30 outputted from the DRAM controller 14. The other input port thereof is supplied with the CAS signal 31 outputted from the DRAM controller 14. The delay circuit 64 delays the CAS signal 31 by a predetermined time interval and supplies the delayed signal to the control circuit 22. The hold circuit 61 has a resistor 65, an inverter 66 and an inverter 67. A first end of the resistor 65 is electrically connected to the output port of the buffer 62 and a second end of the resistor 65 is electrically connected to an input port of the inverter 66 and an output port of the inverter 67. An output port of the inverter 66 is electrically connected to an input port of the inverter 67.

When both the RAS signal 30 and CAS signal 31 outputted from the DRAM controller 14 are "H" in level as indicated at times t3 and t4 illustrated in a timing chart of FIG. 9B, the AND circuit 63 outputs an "L" signal to the control port of the tristate buffer 62. At this time, the buffer 62 enters into a state of allowing the row/column address signal 29 outputted from the MUX 13 to pass to the ATD circuit 21. If the row/column address signal 29 transmitted through the buffer 62 is now of "0", then "0" is input to the inverter 66 of the hold circuit 61 through the resistor 65. Thus, the level of the output of the inverter 66 reaches "1" and the level of the output of the inverter 67 becomes "0". On the other hand, if the row/column address signal 29 is of "1", then "1" is input to the inverter 66 through the resistor 65. As a result, the level of the output of the inverter 66 becomes "0" and the level of the output of the inverter 67 reaches "1". Namely, the state of "0" or "1" of the row/column address signal 29 transmitted through the buffer 62 is held by the hold circuit 61.

When the RAS signal 30 falls from the "H" to "L" at a time t5 as shown in FIG. 9B, the level of the output of the AND circuit 63 is brought to an "H", followed by supply to the buffer 62. Therefore, the buffer 62 is brought into a high impedance state. In this case, the buffer 62 is brought into a state of cutting off the row/column address signal 29 outputted from the MUX 13 Since the row/column address signal 29 is not outputted from the buffer 62, "0" or "1" of the row/column address signal 29, which has been held by the hold circuit 61 immediately before the high impedance state, is outputted to the ATD circuit 21, the row latch circuit 19 and the column latch circuit 20. Namely, since the state of "0" or "1" of the row/column address signal 29 continues, the row address is latched based on the RAS signal 36.

The row/column address signal 29 changes from the row address to the column address at a time t6 shown in FIG. 9B in such a high impedance state. Since, the buffer 62 is placed in the signal cut-off state at this time even if such a glitch as designated at numeral 59 occurs, the influence of the glitch is not produced. Thereafter, when the CAS signal 31 falls from the "H" to the "L" at a time t7, the buffer 62 is brought into the signal passed state so that the column address signal supplied to the input port of the buffer 62 is outputted to the ATD circuit 21, the row latch circuit 19 and the column latch circuit 20. The transition of the row/column address signal 29 from the row address signal to the column address signal is performed at the time t7 as viewed from the ATD circuit 21. Since the glitch is already avoided during the transition at this time even if it is produced as described above, the ATD circuit 21 can detect the normal transition, whereby the normal equalize operation and sense amplifying operation can be carried out.

Further, the delay circuit 64 delays the CAS signal 31 till a time t8 so that the column latch circuit 20 can reliably latch the column address signal selected at the time t7, and outputs the delayed signal to the control circuit 22. Namely, the time necessary for the delay circuit 64 to delay the CAS signal 31 is set to a setup time at which the column latch circuit 20 can latch the column address signal switched from the row address signal when the CAS signal 31 changes from the "H" to the "L", based on the CAS signal 36.

In the first embodiment described above, the start timing and end timing of the logical indeterminate period at the time of the transition of the row/column address signal 29 from the row address to the column address are respectively determined based on the RAS signal 30 and the CAS signal 31. Thus, the first embodiment can solve a problem that since the ATD circuit 21 malfunctions as a result of detection of the glitch or the steplike offset and thereby the width of the first ATD pulse 38 becomes narrow so that the equalize operation is not sufficiently performed as in the prior art, the data amplified by the sense amplifier 16 becomes an inverse relationship between "0" and "1" or is destroyed. The start timing and end timing of the logical indeterminate period may be respectively determined based on the CAS signal 31 and the RAS signal 30.

Figure 10:
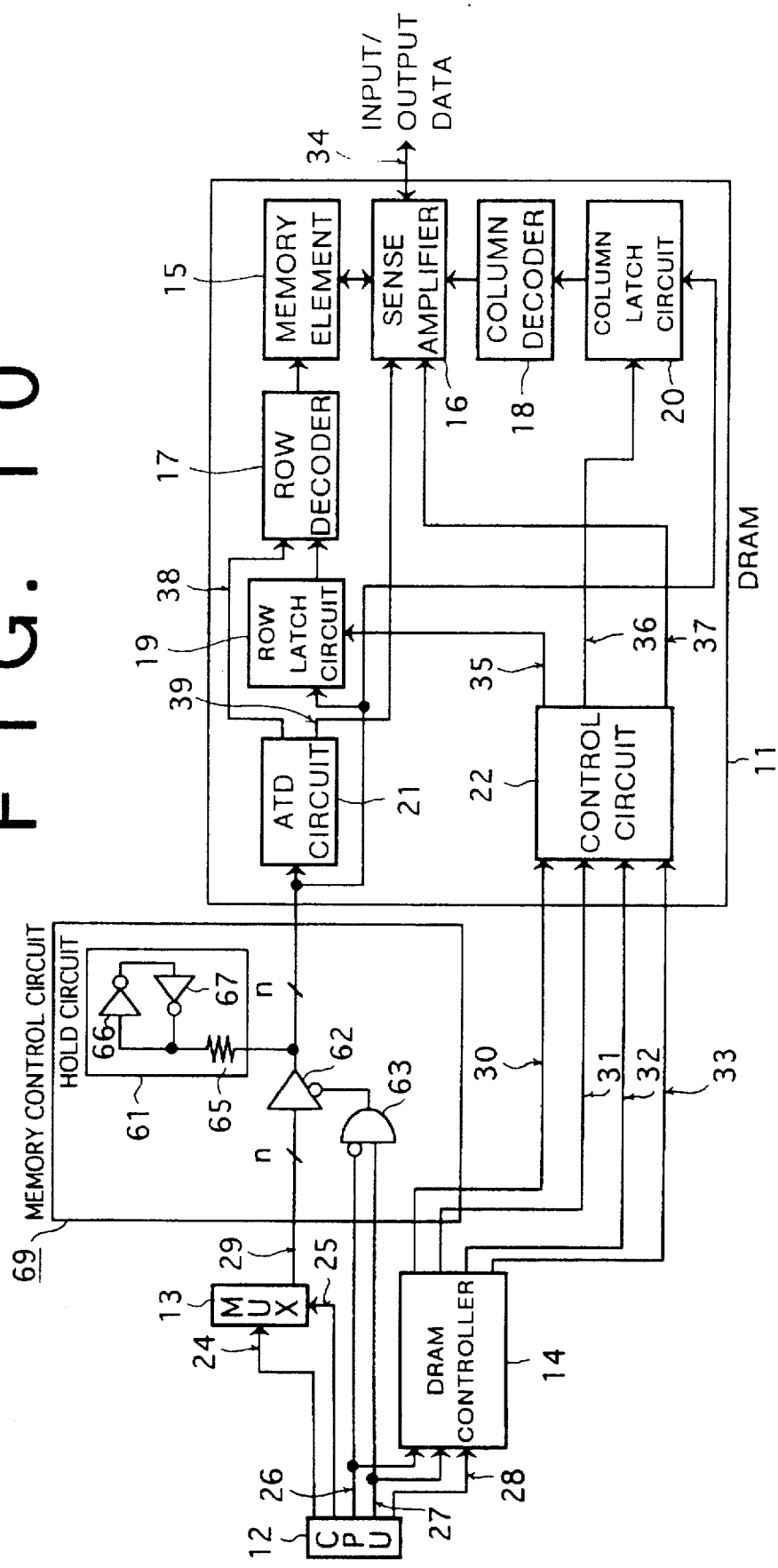
FIG. 10 is a block diagram illustrating a second embodiment of a memory device according to the present invention.

FIG. 10 shows a second embodiment of a memory device according to the present invention. Elements of structure, which are substantially identical to those employed in the first embodiment shown in FIG. 2, are identified by like reference numerals and their description will therefore be omitted. In the second embodiment, a memory control circuit 69 having hardware, which is identical to the memory control circuit 60 shown in FIG. 2, is used. The second embodiment shown in FIG. 10 is different from the first embodiment in that an AND circuit 63 is connected to a CPU 12 without being connected to the DRAM controller 14. Namely, an inversion input port and other input port of the AND circuit 63 are respectively supplied with a PAS generating clock signal 26 and a CAS generating clock signal 27 outputted from the CPU 12.

According to such a configuration, since the AND circuit 63 is inputted with the PAS generating clock signal 26 and the CAS generating clock signal 27 for respectively generating a RAS signal 30 and a CAS signal 31, the AND circuit 63 performs the same operation as described in the first embodiment. Since, however, both the clock signals 26 and 27 are determined early as compared with the RAS signal 30 and the CAS signal 31, the control on the set/reset of a high impedance state of a buffer 62 is performed with timing earlier than that described in the first embodiment. Namely, when the RAS generating clock signal 26 falls from an "H" to an "L", the level of the output of the AND circuit 63 is rendered "H" and supplied to the buffer 62, so that the buffer 62 is brought into the high impedance state. In this case, the buffer 62 cuts off a row/column address signal 29 so that the row/column address signal 29 of "0" or "1", which has been held in the hold circuit 61 immediately before the high impedance state is outputted to an ATD circuit 21, a row latch circuit 19 and a column latch circuit 20. Namely, since the state of "0" or "1" of the row/column address signal 29 is continuously kept, the row address is latched based on a RAS signal 36.

The row/column address signal 29 changes from the row address to the column address in such a high impedance state. Since, at this time, the buffer 62 is placed in the signal cut-off state even if a glitch is produced, the glitch is avoided. Thereafter, when the CAS generating clock signal 27 falls from the "H" to the "L", the buffer 62 is brought into the signal passed state so that the column address signal supplied to an input port of the buffer 62 is outputted to the ATD circuit 21, the row latch circuit 19 and the column latch circuit 20. Since the normal transition from the row address signal to the column address signal as viewed from the ATD circuit 21 at the time of the signal passed state, is detected by the ATD circuit 21, the normal equalize operation and sense amplifying operation are carried out.

Since a CAS signal 36 for latching the column address signal is of a signal corresponding to the CAS signal 31 outputted from the DRAM controller 14 with timing later than that at the CAS generating clock signal 27 for transition, the column address signal selected at the time of the preceding signal passed state can be reliably latched in the column latch circuit 20 without being delayed by the delay circuit 64 as in the first embodiment.

Even in the case of the second embodiment described above, the same advantageous effect as that obtained in the first embodiment can be brought about. Further, since the delay circuit 64 is unnecessary, the second embodiment can be reduced in size correspondingly as compared with the first embodiment. Although the start timing and end timing of the logical indeterminate period are respectively determined based on the clock signals 26 and 27, they may be determined in reverse.

Figure 11:
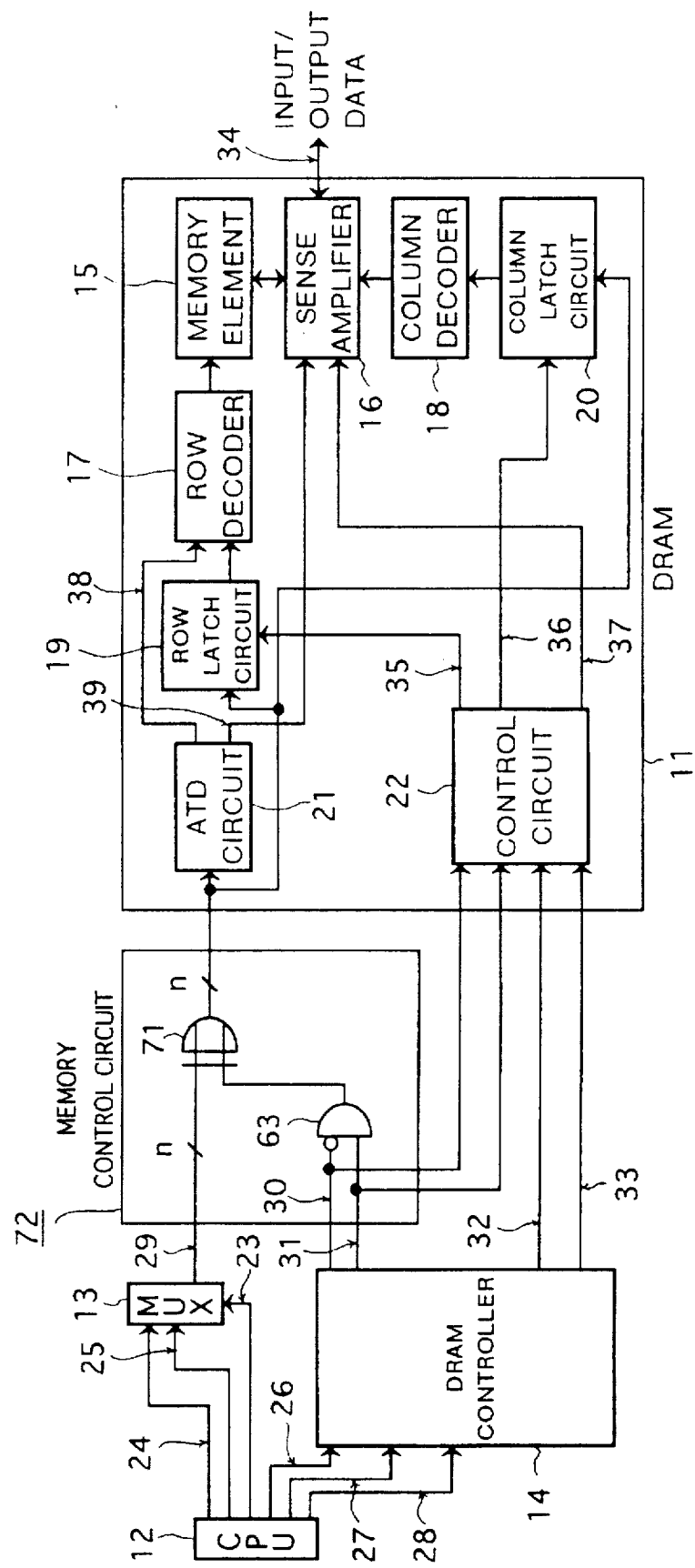
FIG. 11 is a block diagram showing a third embodiment of a memory device according to the present invention.

FIG. 11 shows a third embodiment of a memory device according to the present invention. Elements of structure, which are substantially identical to those employed in the first embodiment, are identified by the same reference numerals and their description will therefore be omitted. In the present embodiment, a memory control circuit 72 having an AND circuit 63 and an exclusive OR (EXOR) circuit 71 is used so as to forcefully invert the logic of a row/column address signal 29 with predetermined timing. This timing is set right close to the aforementioned logical indeterminate period, preferably to EL period immediately before the logical indeterminate period.

An inversion input port and other input port of the AND circuit 63 are respectively supplied with a RAS signal 30 and a CAS signal 31 outputted from a DRAM controller 14. An output port of the AND circuit 63 is electrically connected to one input port of the EXOR circuit 71. The other input port of the EXOR circuit 71 is supplied with the row/column address signal 29 outputted from the MUX 13. An output port of the EXOR circuit 71 is electrically connected to an ATD circuit 21, a row latch circuit 19 and a column latch circuit 20.

Figure 12:
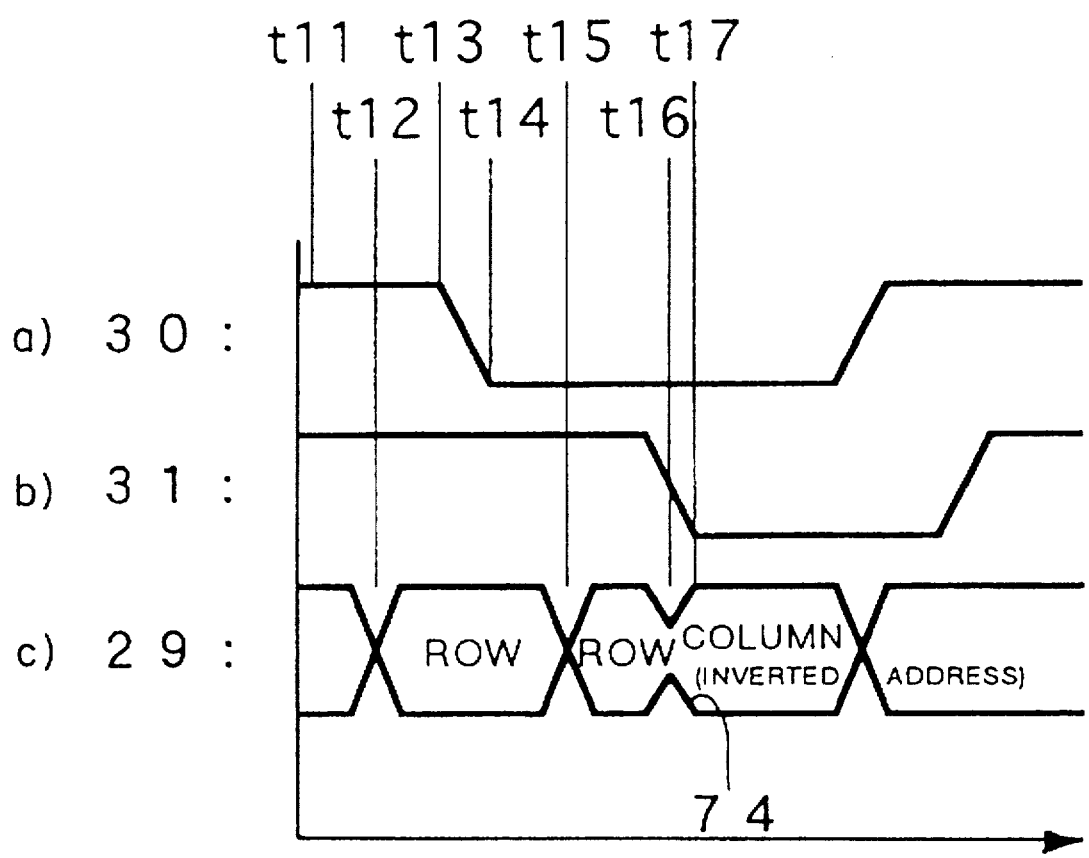
FIG. 12 is a timing chart for describing the operation of the memory device shown in FIG. 11.

When the RAS signal 30 and the CAS signal 31 are both "H" as indicated by a time interval between times t11 and t13 illustrated in a timing chart shown in FIG. 12, the AND circuit 63 outputs data of "L" to one input port of the EXOR circuit 71. In this case, the EXOR circuit 71 outputs a row address signal which has been selected from the row/column address signal 29 at a time t12, to the ATD) circuit 21, the row latch circuit 19 and the column latch circuit 20. Thereafter, when the RAS signal 30 falls at a time t14, the level of the output of the AND circuit 63 is rendered "H" and supplied to the EXOR circuit 71. Therefore, data at the row address is inverted as indicated at a time t15. Since noise such as a glitch or the like is not produced upon its inversion, the ATD circuit 21 can control the proper equalize operation and sense amplifying operation.

Thereafter, the row/column address signal 29 changes from the row address signal to the column address signal at a time t16. Since, at this time, the equalize operation and the sense amplifying operation, i.e., the internal operations have been already completed even if the glitch is produced as designated at numeral 74, the ATD circuit 21 does not malfunction. Further, the changed column address signal has been inverted either in a manner similar to the row address signal. When the CAS signal 31 falls at a time t17, the level of the output of the AND circuit 63 is rendered "L" and supplied to the EXOR circuit 71, so that the column address signal is inverted so as to be returned to a state prior to a forcefully inverted state at the time t15. However, the column address signal identical in mode to the row address signal subjected to the forced inversion at the time t15 is latched in the column latch circuit 20 based on the CAS signal 36 corresponding to the CAS signal 31 at the time t17. Thus, since the address is accessed in the same logic even upon reading and writing although the logic of the address works in reverse due to the forced inversion, a problem does not arise that the logic of data produces an error.

Even in the case of the third embodiment described above, the same advantageous effect as that obtained in the first embodiment can be brought about. Further, the third embodiment can be constructed in a simpler circuit. Although the logic inverting timing is determined based on the RAS signal 30, it may be determined based on the CAS signal 31.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A memory device comprising:
   a memory element having a plurality of memory cells each specified by a row address signal and a column address signal;
   means for detecting a transition between the row address signal and the column address signal to thereby effect an equalize operation on said memory element;
   means for cutting off the supply of a row/column address signal including the row address signal and the column address signal to said memory element during an address transition period, said address transition period being determined as a period which occurs between an edge of a row address strobe signal for capturing the row address signal and an edge of a column address strobe signal for capturing the column address signal; and
   means for holding the row/column address signal immediately before the cutoff of the supply of the row/column address signal to said memory element and supplying the held signal to said memory element during said address transition period.

2. A memory device according to claim 1, wherein the row address strobe signal is generated based on a first clock signal, and the column address strobe signal is generated based on a second clock signal.

3. A memory device according to claim 1 comprising:
   a memory element having a plurality of memory cells each specified by a row address signal and a column address signal;
   means for detecting a transition between the row address signal and the column address signal to thereby effect an equalize operation on said memory element;
   means for cutting off the supply of a row/column address signal including the row address signal and the column address signal to said memory element during a logical indeterminate period at the time of said transition; and
   means for holding the row/column address signal immediately before the cutoff of the supply of the row/column address signal to said memory element and supplying the held signal to said memory element during said logical indeterminate period, wherein said cutting means includes,
   a tristate buffer having a first input port supplied with the row/column address signal, a first output port, and a control port, and
   an AND circuit having second and a third input ports either of which serves as an inversion input, and a second output port, said second and third input ports being respectively supplied with the row address strobe signal and the column address strobe signal and said second output port being connected to the control port,
   said detecting means includes an address transition detecting circuit operatively connected to the first output port and said memory element, and
   said holding means includes a hold circuit operatively connected to the first output port and said address transition detecting circuit.

4. A memory device comprising:
   a memory element having a plurality of memory cells each specified by a row address signal and a column address signal;
   means for detecting a transition between the row address signal and the column address signal to thereby effect an equalize operation on said memory element;
   means for cutting off the supply of a row/column address signal including the row address signal and the column address signal to said memory element during a logical indeterminate period at the time of said transition; and
   means for holding the row/column address signal immediately before the cutoff of the supply of the row/column address signal to said memory element and supplying the held signal to said memory element during said logical indeterminate period, further comprising means for delaying the column address strobe signal, said delaying means providing reliable capture of the column address signal.

5. A memory device comprising:
   a memory element having a plurality of memory cells each specified by a row address signal and a column address signal;
   means for detecting a transition between the row address signal and the column address signal to thereby effect an equalize operation on said memory element,
   means for cutting off the supply of a row/column address signal including the row address signal and the column address signal to said memory element during a logical indeterminate period at the time of said transition; and
   means for holding the row/column address signal immediately before the cutoff of the supply of the row/column address signal to said memory element and supplying the held signal to said memory element during said indeterminate period, wherein said cutting means includes,
   a tristate buffer having a first input port supplied with the row/column address signal, a first output port, and a control port, and
   an AND circuit having second and a third input ports either of which serves as an inversion input, and a second output port, said second and third input port being respectively supplied with the first clock signal and the second clock signal and said second output port being connected to the control port, said detecting means includes an address transition detecting circuit operatively connected to the first output port and said memory element, and said holding means includes a hold circuit operatively connected to the first output port and said address transition detecting circuit.

6. A memory control circuit suitable for use in a memory device for detecting a transition between a row address signal and a column address signal to thereby carry out an equalize operation, comprising:

means for cutting off the supply of a row/column address signal including the row address signal and the column address signal to said memory device during an address transition period, said address transition period being determined as a period which occurs between an edge of a row address strobe signal for capturing the row address signal and an edge of a column address strobe signal for capturing the column address signal; and means for holding the row/column address signal immediately before the cutoff of the supply of the row/column address signal to said memory device and supplying the held signal to said memory device during said address transition period.

7. A memory device comprising:

a memory element having a plurality of memory cells each specified by a row address signal and a column address signal;

means for detecting a transition between the row address signal and the column address signal to thereby effect an equalize operation on said memory element; and means for forcefully inverting the logic of a row/column address signal including the row address signal and the column address signal with timing close to a logical indeterminate period at the time of said transition.

8. A memory device according to claim 7, wherein the timing at which the logic of the row/column address signal is inverted, is determined by either one of the row address strobe signal and the column address strobe signal.

9. A memory device comprising:

a memory element having a plurality of memory cells each specified by a row address signal and a column address signal;

means for detecting a transition between the row address signal and the column address signal to thereby effect an equalize operation of said memory element; and means for forcefully inverting the logic of a row/column address signal including the row address signal and the column address signal with timing close to a logical indeterminate period at the time of said transition, wherein said inverting means includes, an exclusive OR circuit having first and a second input ports and a first output port, said first input port being supplied with the row/column address signal, an AND circuit having third and a fourth input ports either of which serves as an inversion input, and a second output port, said third and fourth input ports being respectively supplied with the row address strobe signal and the column address strobe signal and said second output port being connected to the second input port, and said detecting means includes an address transition detecting circuit operatively connected to the first output port and said memory element.

10. A memory control circuit suitable for use in a memory device for detecting a transition between a row address signal and a column address signal to thereby carry out an equalize operation, comprising:

means for forcefully inverting the logic of a row/column address signal including the row address signal and the column address signal with timing close to an address transition period, said address transition period being determined as a period which occurs between an edge of a row address strobe signal for capturing the row address signal and an edge of a column address strobe signal for capturing the column address signal; and means for restoring the inverted logic to an original state.

* * * * *